(12) United States Patent
Steineke et al.

(10) Patent No.: US 8,760,171 B2
(45) Date of Patent: Jun. 24, 2014

(54) DEVICE AND METHOD FOR DETERMINING PARTIAL DISCHARGES AT AN ELECTRICAL COMPONENT

(75) Inventors: Caspar Steineke, Berlin (DE); Harald Emanuel, Berlin (DE); Ronald Plath, Berlin (DE)

(73) Assignee: Omicron Electronics GmbH, Klaus (AT)

(*) Notice: Subject to any disclaimer, the term of this patent is extended or adjusted under 35 U.S.C. 154(b) by 406 days.

(21) Appl. No.: 13/142,920

(22) PCT Filed: Dec. 23, 2009

(86) PCT No.: PCT/EP2009/009262
§ 371 (c)(1),
(2), (4) Date: Aug. 9, 2011

(87) PCT Pub. No.: WO2010/076002
PCT Pub. Date: Jul. 8, 2010

(65) Prior Publication Data
US 2011/0291666 A1    Dec. 1, 2011

(30) Foreign Application Priority Data
Dec. 30, 2008   (EP) .................................... 08022578

(51) Int. Cl.
*G01R 31/02* (2006.01)

(52) U.S. Cl.
USPC ............................ 324/551; 324/555; 324/536

(58) Field of Classification Search
USPC .................................. 324/551, 541, 536, 555
See application file for complete search history.

(56) References Cited

U.S. PATENT DOCUMENTS

| 4,063,168 | A | | 12/1977 | Franke |
| 5,602,709 | A | | 2/1997 | Al-Dabbagh |
| 5,933,012 | A | * | 8/1999 | Bengtsson et al. ............ 324/524 |
| 6,297,645 | B1 | | 10/2001 | Eriksson |
| 6,377,427 | B1 | | 4/2002 | Haun |

FOREIGN PATENT DOCUMENTS

EP   WO 2007/144789   12/2007

* cited by examiner

*Primary Examiner* — Vincent Q Nguyen
(74) *Attorney, Agent, or Firm* — Workman Nydegger (57) ABSTRACT

The present invention relates to a method for determining partial discharges at an electrical component (10). In the case of the method, an electrical signal that comprises partial discharge pulses due to the partial discharges at the electrical component (10) is detected. Through filtering of the electrical signal by means of n filters (18-20) having n differing filter characteristics, n filtered partial discharge signals are generated. Respectively one of the filtered partial discharge signals is assigned, respectively, to one of the n filters (18-20), n being greater than or equal to two. Finally, the partial discharges are determined by linking the n filtered partial discharge signals.

16 Claims, 9 Drawing Sheets

DEVICE AND METHOD FOR DETERMINING PARTIAL DISCHARGES AT AN ELECTRICAL COMPONENT

BACKGROUND

The present invention relates to a method and a device for determining partial discharges at an electrical component, which method and device can be used, in particular, in performing partial discharge measurements of electrical components such as, for example, high-voltage cables, rotating machines, transformers or the like.

A partial discharge measurement is a globally recognized method for quality control, both in the laboratory and in the field. Partial discharges are defined according to IEC 60270 as localized dielectric breakdowns of a small portion of a solid or liquid electrical insulation system under high voltage stress. In many cases, partial discharges indicate insulation defects at high-voltage components. Reliable recognition and monitoring of partial discharges protects against cost-intensive failures and repairs, and is therefore critically important. The partial discharge measurement is one of the main criteria in the evaluation of the quality of a cable or a set of cable fittings, and of their on-site installation.

Figure 1A:
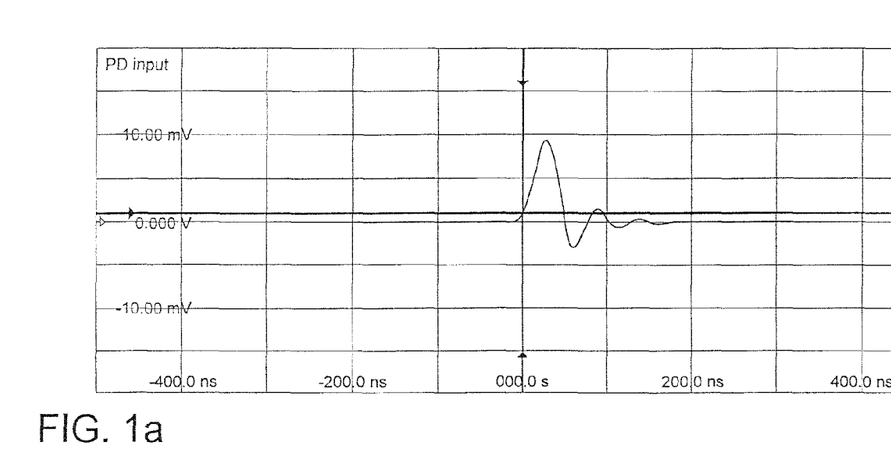
FIG. 1 shows an ideal partial discharge pulse in the time and frequency domain.
Figure 1B:
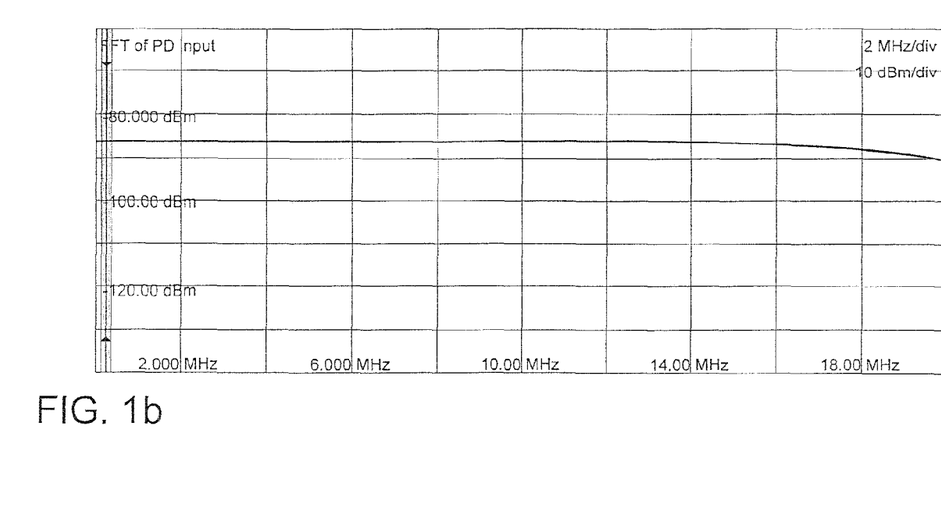
Figure 2A:
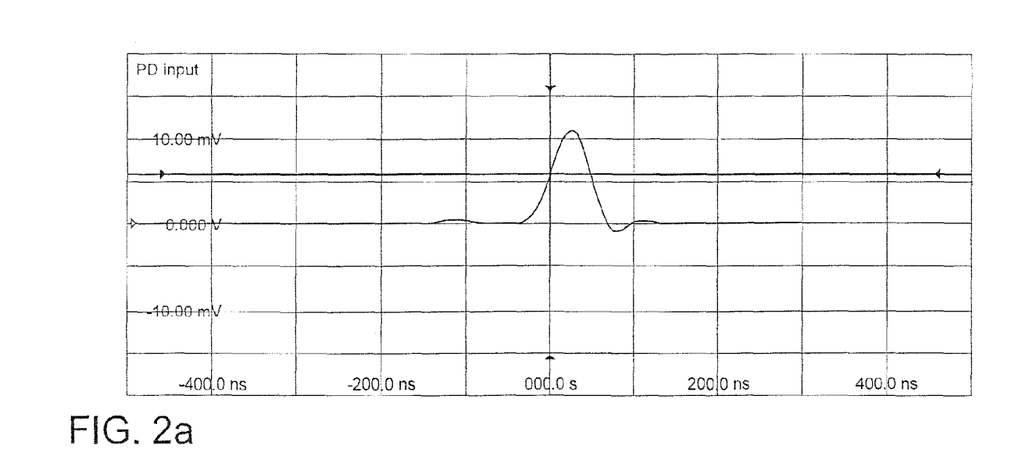
FIG. 2 shows a low-pass-filtered partial discharge pulse in the time and frequency domain.
Figure 2B:
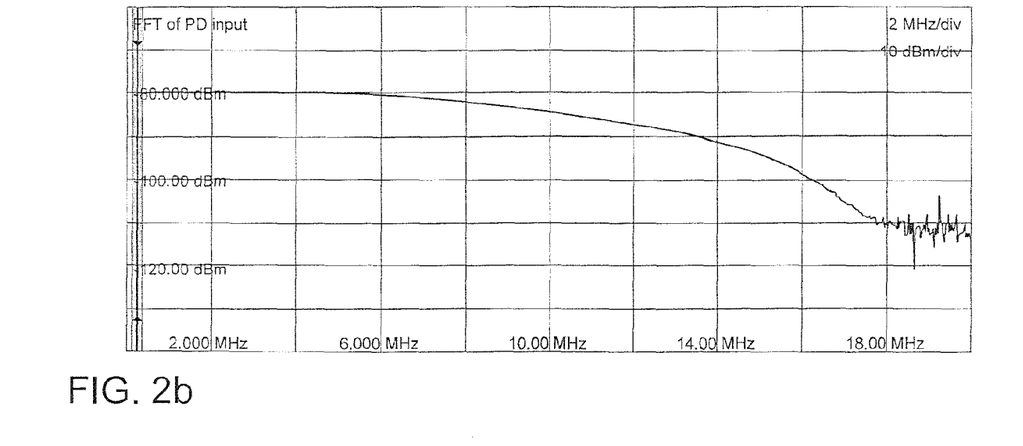
Figure 3A:
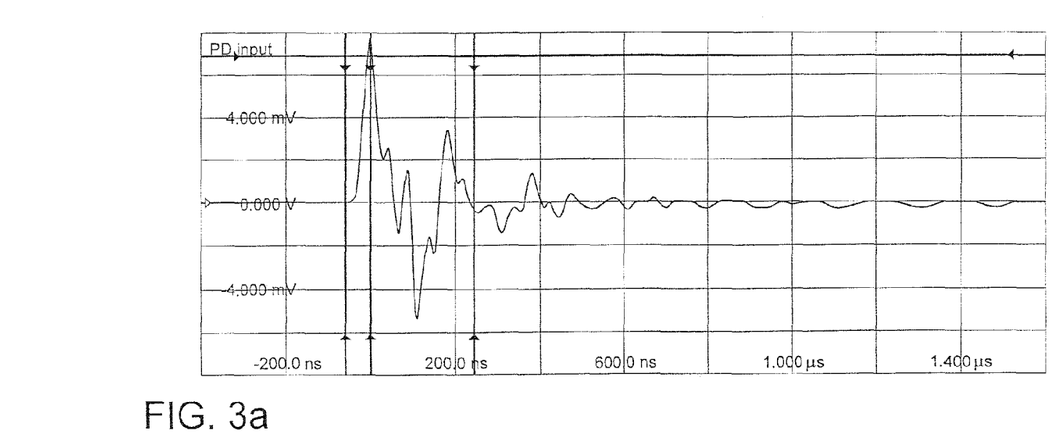
FIG. 3 shows a real partial discharge pulse in the time and frequency domain.
Figure 3B:
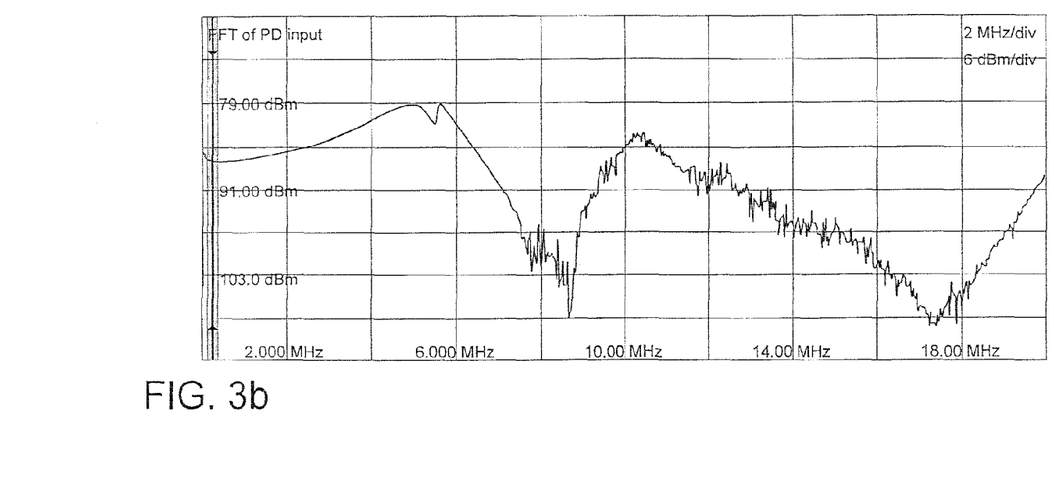

Cables themselves are tested, for example, by means of a sensitive partial discharge measurement. During their production, the cables are tested in a shielded laboratory. For this purpose, the cable is subjected to a high voltage, for example an a.c. operating voltage of the cable, and a partial discharge measuring device is used to measure the partial discharges over a predefined period of time. Owing to the differing causes of partial discharges such as, for example, air inclusions in the insulation, in the case of the applied a.c. voltage partial discharges occur at differing times in the course of a period of the a.c. voltage. Each partial discharge causes a current pulse or current surge, which is converted, by means of a coupling capacitor and a measuring impedance, into a corresponding voltage pulse. This voltage pulse is then processed further to determine the partial discharge. FIG. 1a shows the waveform of such a voltage pulse in the time domain, and FIG. 1b shows the frequency spectrum of the voltage pulse of FIG. 1a. The voltage pulse shown in FIG. 1 is an almost ideal voltage pulse from a partial discharge calibration device. Since, however, the partial discharge occurs in a cable or in a comparable test object such as, for example, an electrical machine or a transformer, and the voltage signal can only be measured outside the test object, the voltage signal undergoes low-pass filtering before it can be measured, owing to the electrical properties of the test object. FIG. 2a shows a low-pass-filtered voltage pulse signal, and FIG. 2b shows the corresponding frequency spectrum. However, real test objects such as, for example, high-voltage cables or other electrical machines give rise to very complex filterings of the partial discharge signal. An example of a real partial discharge signal of a real test object is represented in FIG. 3a, and FIG. 3b shows the corresponding frequency spectrum of the partial discharge signal.

Figure 4:
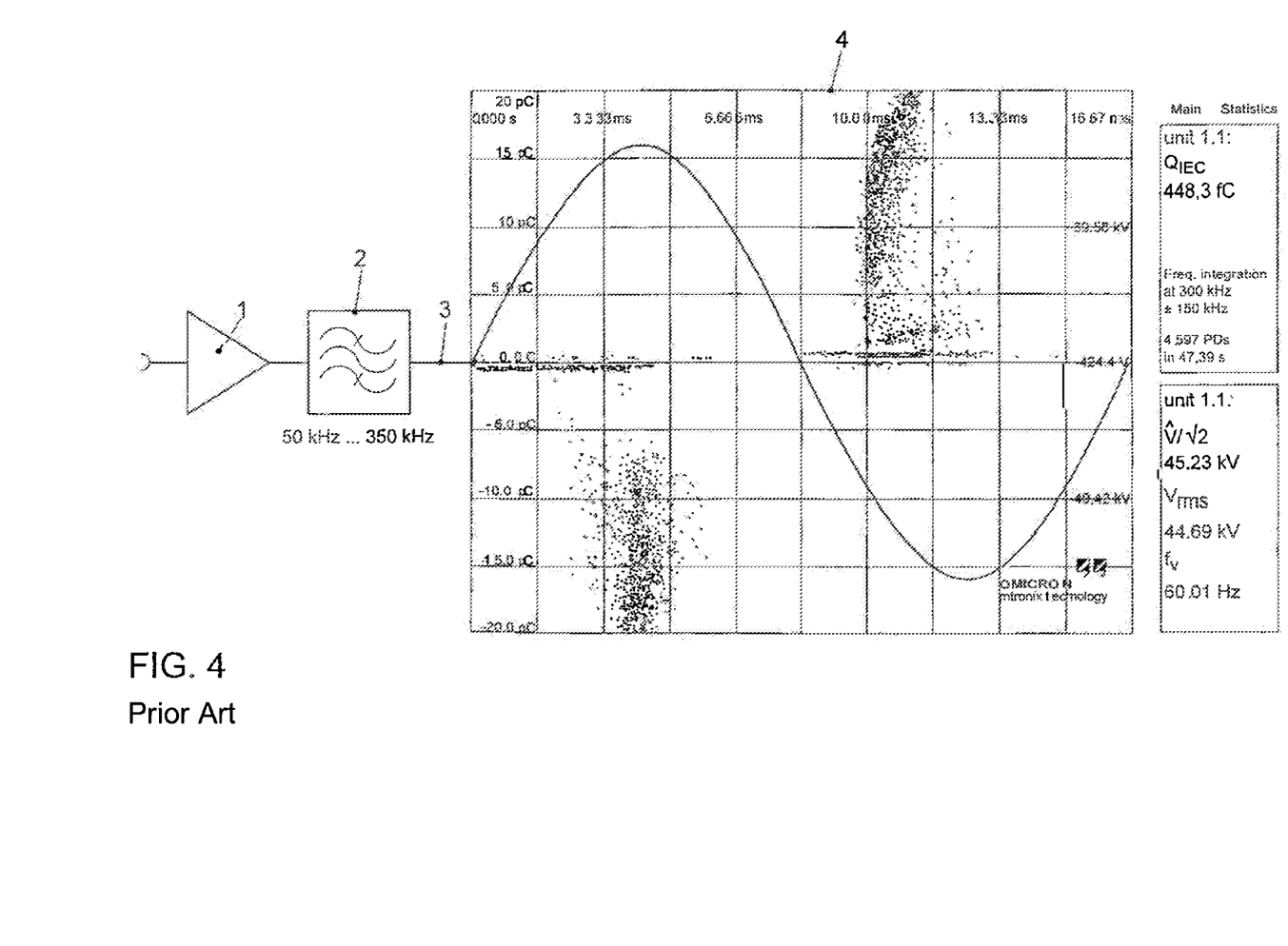
FIG. 4 shows a device for determining partial discharges according to the prior art.
Figure 5:
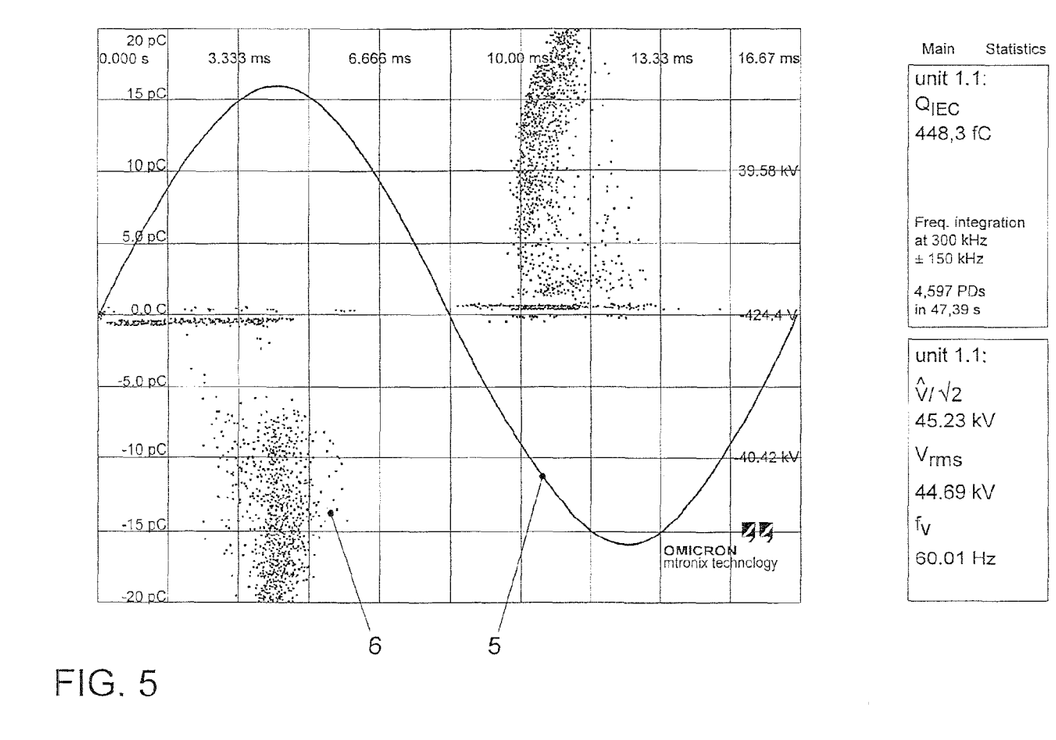
FIG. 5 shows an output of a device for determining partial discharges at an electrical component.

As mentioned previously, the partial discharges in the test object can be converted into a corresponding voltage signal, for example by means of a coupling capacitor and a measuring impedance. For the purpose of determining the partial discharge of the test object, this voltage signal, as shown in FIG. 4, is amplified by means of an amplifier 1 and filtered by means of a bandpass filter 2. The filter usually has a variable upper and lower cut-off frequency. The filtering is usually set to a frequency band having a low disturbance level, in which the broadband partial discharge pulse contrasts clearly with the background noise. The filter can be, for example, a bandpass filter having a passband range from 50 to 350 kHz. The low-pass characteristic of the filter provides for integration of the pulse waveform, such that a charge-proportional signal 3 is obtained. The charge-proportional signal 3 is supplied to a processing unit 4, which collects the charge-proportional signals obtained in a predefined period of time as a result of a plurality of partial discharges, and represents them, for example in the manner represented in FIG. 4, over the voltage applied to the test object. FIG. 5 shows this representation in detail. A complete phase cycle of the voltage applied to the test object is represented as a graph 5 over time. In the present example, the a.c. voltage applied to the test object has a frequency of approximately 60 Hz, such that a complete cycle takes approximately 16.67 ms. The test object is subjected to the test voltage, indicated by the graph 5, for a predefined period of time, being 47.39 s in the present example. Very many partial discharges, which are each entered as a dot 6 in the diagram represented in FIG. 5, occur in the test period. A partial discharge is entered in the diagram in respect of its phase position in relation to the test voltage 5 and the magnitude of its charge. If there is a greater accumulation of points 6 at a location in the diagram, this accumulation can be marked, for example, through use of a different colour for the points 6, in dependence on the frequency. A cause of the partial discharges can be inferred from the phase position, magnitude of charge, charge sign and the frequency. Finally, the processing unit 4 determines an overall charge of the partial discharges over the predefined period of time, which overall charge indicates the quality of the test object, for example of a high-voltage cable of predefined length.

In the case of the previously described method for determining the partial discharges in a test object, various problems can occur, which can falsify the partial discharge measurement result. For example, external disturbance quantities such as, for example, electromagnetic radio waves, can produce signals in the test object that are erroneously evaluated as a partial discharge pulse. It is usually attempted to eliminate such disturbance sources by operating the test object and the measuring device in a shielded room. This is very demanding of resources, however, particularly in the case of large test objects such as, for example, electrical machines or transformers. Furthermore, it is attempted to prevent such disturbances through use of an appropriate filter 2. In this case, however, there is the risk of actual partial discharge signals also being filtered out, in addition to the disturbance signals.

A further problem in partial discharge measurement is the separation of a plurality of superposed partial discharge sources from one another. In the case of the superposition of a plurality of partial discharge sources and/or of stochastic pulse-type disturbance sources, a superposed signal, or pulse mixture, which does not afford precise information concerning the nature and intensity of individual partial discharge sources in the test object examined, is produced at the output of the filter 2. The informative quality of the partial discharge measurement result can be diminished as a result. A further, specific problem in partial discharge measurement, particularly on cables, is that of so-called negative superposition. In this case, a partial discharge pulse reflected at the cable end becomes superposed on an original partial discharge pulse. In the case of certain cable lengths, this, in combination with filter natural oscillations and/or zeroizing of the bandpass filter 2, results in a negative superposition, or even extinction, as a result of which a partial discharge fault on the cable can be overlooked. In order to preclude such a negative superposition behaviour, partial discharge measuring devices are usually tested by double pulse calibrators. In this case, two successive pulses of defined charge are input, at a variable and defined interval, into the measuring system, wherein the display reading may only deviate downwards by less than 10% from the charge value of the pulse. This requires elaborate bandpass filters 2 that pass these tests, and may possibly result in bandpass limitations of the bandpass filter 2.

SUMMARY

The present invention is therefore based on the object of providing a device and a method for determining partial discharges at an electrical component, by means of which the previously mentioned problems can be eliminated. In particular, the invention is based on the object of providing a device and a method for determining partial discharges at an electrical component such as, for example, transformers, rotating machines or cables, that enable partial discharge measurement to be performed in a cost-effective and reliable manner.

According to the present invention, a method is provided for determining partial discharges at an electrical component. The electrical component can be, for example, a high-voltage cable, a transformer, an electrical generator, an electrical drive machine or the like. In particular, the electrical component can be an electrical component that is suitable for operation with a medium voltage or a high voltage, i.e. a voltage of some kV. In the case of the method, an electrical signal that comprises partial discharge pulses due to the partial discharges at the electrical component is detected. The electrical signal can be detected, for example, as previously described in the invention, by means of a coupling capacitor and a measuring impedance. The detected electrical signal is then supplied to a plurality of filters having differing filter characteristics. From the electrical signal, each of the plurality of filters generates, respectively, a filtered partial discharge signal. The filters are at least two in number. The partial discharges at the electrical component are then determined by linking the plurality of filtered partial discharge signals.

According to one embodiment, an n-tuple is formed per partial discharge pulse, values of the n-tuple corresponding to the n plurality of filtered partial discharge signals of the partial discharge pulse. A plurality of n-tuples of a plurality of partial discharge pulses are then processed further by means of a cluster analysis. If, for example, n filtered partial discharge signals are generated, by means of n filters, for each partial discharge pulse and entered in a corresponding n-tuple, this n-tuple can be entered into an n-dimensional mapping space. If a plurality of n-tuples of a plurality of partial discharge pulses are entered into the n-dimensional mapping space, clusters at certain locations in the mapping space can be determined by means of a cluster analysis. The position of the cluster of the cluster analysis can then be used, for example, to identify a partial discharge source that causes a partial discharge in the electrical components. A combination of differing clusters of the cluster analysis can also be used to identify such a partial discharge source. One or more clusters thus constitutes a kind of signature of a partial discharge phenomenon that is caused, as one or more partial discharges, by a partial discharge source. Since each partial discharge is filtered by means of the n filters having the n differing filter characteristics, this partial discharge signature can be easily identified in the mapping space of the cluster analysis. Partial discharge sources, i.e. causes of partial discharges in the electrical component, are thereby easily identified.

According to a further embodiment, disturbance sources that feed disturbance signals into the electrical signal can be identified on the basis of a cluster, or of a plurality of clusters, of the cluster analysis. Such disturbance sources can be, for example, electromagnetic high-frequency signals that enter the electrical component, where they generate disturbance signals that generate, over the electrical signal, signal pulses in a manner similar to the partial discharges. These signals pulses likewise run through the n filters and are reproduced, as previously described, as n-tuples in the mapping space of the cluster analysis. Such a disturbance signal, and therefore such a disturbance source, can be identified on the basis of the signature of the disturbance source, i.e. on the basis of the position of one or more clusters of the cluster analysis. Only those filtered partial discharge signals that were not generated by the disturbance source are then used to determine the partial discharges at the electrical component. As a result, the partial discharges at the electrical component can be determined with considerably greater precision, since disturbance signals from disturbance sources can be easily identified by means of the cluster analysis and excluded from the determination of the partial discharges.

According to a further embodiment of the present invention, a respective amount is determined for each of the n filtered partial discharge signals, and the amounts of the n filtered partial discharge signals are added in a weighted manner. The determining of the amount of a filtered partial discharge signal can comprise, for example, squaring of the filtered partial discharge signal. For example, three filtered partial discharge signals can be generated by filtering of the electrical signals by means of three filters having three differing filter characteristics. A first of the three filters can be, for example, a bandpass filter having a passband range of approximately 82 to 243 kHz, a second of the three filters can be a bandpass filter having a passband range of approximately 227 to 387 kHz, and a third of the three filters can be a bandpass filter having a passband range of approximately 377 to 537 kHz. The following values, for example, can be used as weighting factors for the weighted adding of the amounts of the three filtered partial discharge signals. The partial discharge signal filtered by the first filter can be weighted with the value 1, the partial discharge signal filtered by the second filter can be weighted with the value 1.1, and the partial discharge signal filtered by the third filter an be weighted with the value 1. After the weighted adding, a partial discharge signal is obtained that is similar to the filtered partial discharge signal 3, according to the prior art, that is produced by means of the bandpass filter 2, as described in connection with FIG. 4. The advantage of the partial discharge signal according to the invention that is formed from the weighted addition, as compared with the partial discharge signal 3 from the prior art, is that the partial discharge signal according to the invention avoids the problem of the previously described superposition, in particular the negative superposition, since the partial discharge signal according to the invention is formed from a combination of a plurality of bandpass-filtered partial discharge signals, as a result of which the weaknesses of practical filters such as, for example, filter natural oscillations and zeroizing, are bypassed because of the differing filter characteristics of the plurality of bandpass filers. Whereas, in the case of the bandpass filer according to the prior art, negative superpositions or even extinctions can occur in the case of certain pulse combinations, in the case of the filter structure according to the invention such superpositions or extinctions of a specific partial discharge pulse can only ever occur at one of the plurality of bandpass filters, while the rest of the plurality of bandpass filters are robust, in respect of superposition or extinction, towards the specific partial discharge pulse. In the aggregate signal, therefore, a superposition or extinction can be reliably reduced. It has been found in practice that particularly reliable partial discharge measurements could be performed with three filters having the above-mentioned passband ranges and the above-mentioned weighting factors.

Additionally provided according to the present invention is a device for determining partial discharges at an electrical component. The device comprises an input connector for coupling the device to the electrical component, n filters and a processing unit. An electrical signal from the electrical component such as, for example, a high-voltage cable, a transformer, an electrical generator or an electrical drive machine, can be supplied to the device via the input connector. The electrical signal comprises partial discharge pulses that occur because of the partial discharges at the electrical component. The n filters are each coupled, on the input side, to the input connector. The n filters are each equipped in such a way that, on the output side, they provide filtered partial discharge signals in dependence on the electrical signal. Thus, n filtered partial discharge signals are provided at the n outputs of the n filters. The n filters have n differing filter characteristics. The device comprises at least two filters, i.e. n≥2. The processing unit is coupled to the outputs of the n filters and equipped in such a way that it determines the partial discharges by linking the n filtered partial discharge signals.

According to one embodiment, the processing unit forms an n-tuple for each partial discharge pulse, the n values of the n-tuple corresponding to the n filtered partial discharge signals of the partial discharge pulse. A filtered partial discharge signal can comprise, for example, a charge-proportional signal of the partial discharge pulse in dependence on the filter characteristic of the corresponding filter. The processing unit comprises a cluster analysis unit that determines clusters or accumulations of partial discharge pulses by means of a cluster analysis of a plurality of n-tuples of a plurality of partial discharge pulses. For this purpose, the cluster analysis unit can enter an n-tuple into an n-dimensional mapping space, an n-tuple denoting a dot in the n-dimensional mapping space, each of the n values of the n-tuple being assigned, respectively, to a dimension of the n-dimensional space. If a sufficient number of partial discharge pulses are detected and their corresponding n-tuples entered into the n-dimensional mapping space, accumulations of partial discharge pulses in regions of the mapping space can be determined by means of the cluster analysis. The processing unit can identify causes, so-called partial discharge sources that cause a partial discharge phenomenon at the electrical component, on the basis of the position of the clusters in the mapping space. Partial discharge sources can be identified, for example, through the position of a cluster or through the position of a plurality of clusters. It is thereby possible, not only to determine the partial discharges at the electrical component but, moreover, also to determine partial discharge sources that cause the partial discharges.

The processing unit can additionally use the clusters of the cluster analysis to identify disturbance sources. A disturbance source causes disturbance signals to be present in the electrical signal that, in a manner similar to the partial discharges, generate, after the n filters, signals that are similar to the filtered partial discharge signals. Disturbance signals of typical disturbance sources such as, example, high-frequency radio transmitters, can then be identified by means of the cluster analysis, since these disturbance signals, just as the partial discharges, form characteristic clusters or accumulations in the mapping space. Disturbance signals can therefore be easily identified, and they can be disregarded by the processing unit in the determination of the partial discharges.

According to one embodiment, the processing unit is designed in such a way that it determines amounts of the n filtered partial discharge signals and multiplies each of these n amounts by a weighting factor of its own. The determining of an amount can be effected, for example, by squaring the corresponding filtered partial discharge signal. Furthermore, the processing unit is designed to total the weighted amounts, in order to determine therefrom the amount of a partial discharge of the electrical component. As described previously in connection with the method according to the invention, an amount of a partial discharge that is not falsified by superposition, in particular negative superposition on high-voltage cables, can be determined by using the plurality of filters and combining the filtered partial discharge signals.

According to one embodiment, three filters are used, i.e. n=3. A first of the three filters can be, for example, a bandpass filter having a passband range of approximately 82-243 kHz, a second of the three filters can be a bandpass filter having a passband range of approximately 227-387 kHz, and a third of the three filters can be a bandpass filter having a passband range of approximately 377-537 kHz. The weighting factors are set, for example, as follows: a first weighting factor for the weighted adding of the partial discharge signal filtered by the first filter has the value 1, a second weighting factor for the weighted adding of the partial discharge signal filtered by the second filter has the value 1.1, and a third weighting factor for the weighted adding of the partial discharge signal filtered by the third filter has the value 1. The thus defined filter structure has a passband range of approximately 82-537 kHz and, at the same time, is robust towards a superposition, in particular a negative superposition caused by filter natural oscillations and/or zeroizing in the filter. As a result, extinction or weakening of two rapidly succeeding partial discharge signal pulses, which can originate, for example, from an original pulse and a pulse reflected at the cable end, can be reliably prevented.

BRIEF DESCRIPTION OF THE DRAWINGS

The present invention is explained in the following with reference to the drawings, on the basis of preferred embodiments.

DETAILED DESCRIPTION

Figure 6:
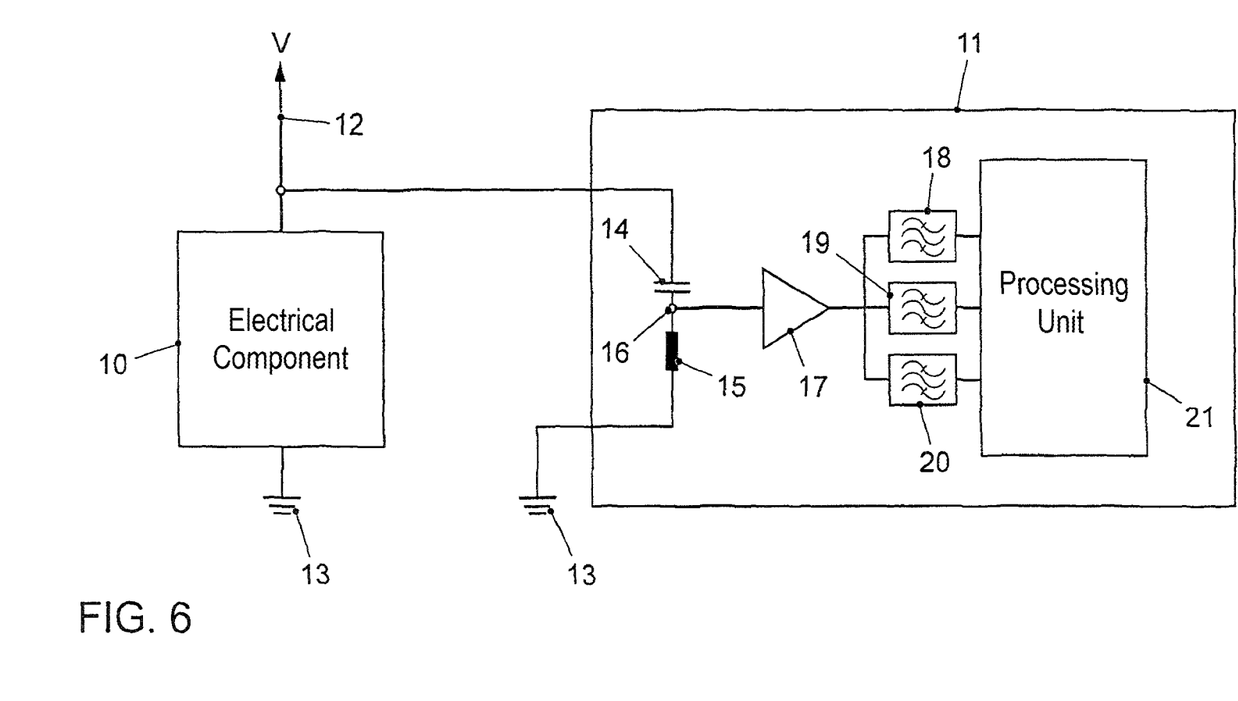
FIG. 6 shows, schematically, a device for determining partial discharges at an electrical component according to the present invention, which device is coupled to the electrical component.

FIG. 6 shows an electrical component 10, and a partial discharge measuring device 11 for determining partial discharges at the electrical component 10. The electrical component 10 can be, for example, an electrical machine such as, for example, an electrical generator or an electrical motor, a transformer or a cable. Partial discharge measurements are usually performed on electrical components that are operated for operation in the medium-voltage or high-voltage range, i.e. with voltages of some kV. The electrical component 10 is connected, via a connection 12, to a corresponding medium-voltage or high-voltage source V, usually an a.c. voltage source. In addition, a housing or a shielding of the electrical component 10 is connected to earth 13. In the following, the electrical component 10 is referred to as the test object 10.

If partial discharges occur at the test object 10 during operation of the test object 10 or in a laboratory partial discharge measurement of same, a charge exchange occurs between the supply voltage V and earth 13. This charge exchange can be converted, for example by means of a series connection of a so-called coupling capacitor 14 and a measuring impedance 15 that are connected, parallel to the test object, between the supply voltage V and earth 13, into a partial discharge voltage that can be tapped at a measuring point 16 between the coupling capacitor 14 and the measuring impedance 15. The measuring impedance 15 can comprise, for example, a resistor, a coil or a combination thereof. A voltage signal that has been produced at the measuring point 16 because of a partial discharge in the test object 10 is represented exemplarily in FIG. 3a. FIG. 3b shows the spectrum of this signal. The integral over this signal is proportional to the charge of the partial discharge in the test object 10. This partial discharge pulse measured at the measuring point 16 is amplified by means of an amplifier 17 of the partial discharge measuring device 11, and supplied to three bandpass filters 18-20 of the partial discharge measuring device 11. Each of the bandpass filters 18-20 has a different passband range, thus, for example, the bandpass filter 18 has a passband range of 82.5-242.5 kHz, the bandpass filter 19 has a passband range of 227-387 kHz, and the bandpass filter 20 has a passband range of 377-537 kHz. The outputs of the bandpass filters 18-20, which are termed filtered partial discharge signals in the following, are supplied to a processing unit 21 of the partial discharge measuring device 11. Because of the bandpass filtering of the filters 18-20, disturbance signals are filtered out at the measuring point 16. These can be, for example, conducted disturbance sources that generate signals in the range from 0 to a few kHz. Moreover, these can be disturbance sources that generate high-frequency signals in the range of some MHz. Moreover, the low-pass filtering of the low-pass filters 18-20 causes the partial discharge pulses to be integrated, such that a value that is proportional to the charge of the partial discharge is provided at the output of each filter.

As has already been described in the introduction, in connection with the partial discharge measuring device according to the prior art (FIG. 4), a partial discharge measurement is performed over a predefined period of time. During this predefined period of time, a multiplicity of partial discharges occur, for example several thousand partial discharges. Since the test object 10 is being energized in a periodic manner, for example by means of an a.c. voltage of 50 or 60 Hz, partial discharges resulting from a disturbance source in the test object such as, for example, an insulation air bubble or the like, occur repeatedly with similar intensity during the measuring period of, for example, some multiple seconds. FIG. 5 shows a representation of the partial discharge results that takes account of the phase position of the partial discharges in relation to the applied a.c. voltage and the magnitude of the partial discharge.

Each partial discharge pulse has a very broad frequency spectrum, as has already been described in connection with FIGS. 1-3. In particular, each partial discharge pulse also has pulse components in the frequency spectra that are defined as passband frequencies of the filters 18-20. Each partial discharge pulse thus results in an signal output at each of the filters 18-20. Depending on the type and position of the partial discharge source, however, differing filtered partial discharge signals are obtained at the outputs of the filters 18-20. Thus, for example, a partial discharge source can result in a large signal at the output of the filter 18 and in a small signal at the outputs of the filters 19 and 20. A further partial discharge source, on the other hand, can result in a large signal at the output of the filter 19, whereas only a small signal is caused at the outputs of the filters 18 and 20. Each partial discharge source thus has its own signature, a so-called frequency signature, which is described by the three values of the filters 18-20. As described in connection with FIG. 7, this frequency signature can be used to perform a cluster analysis of the filtered partial discharge signals and thereby to identify partial discharge sources.

Figure 7:
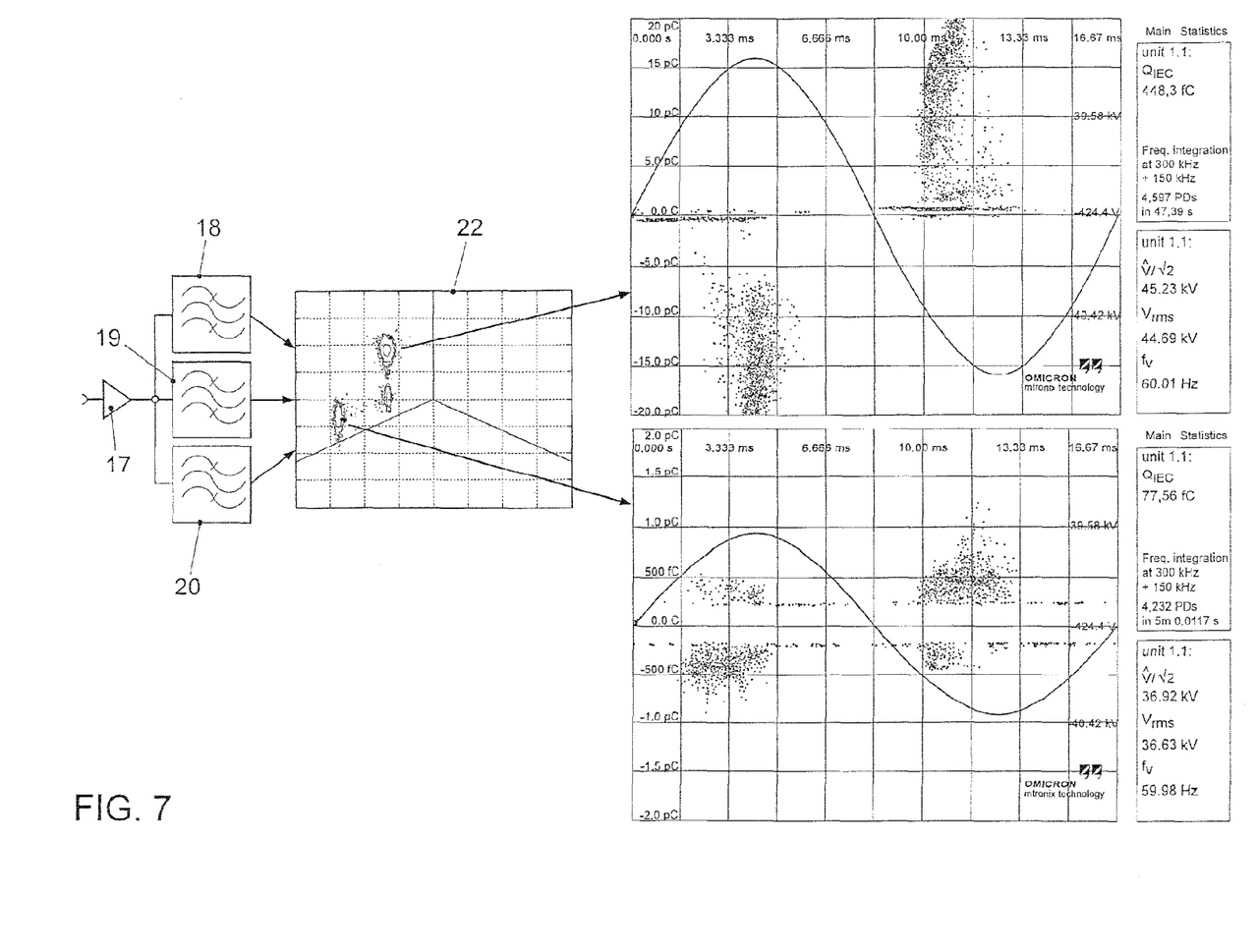
FIG. 7 shows, schematically, the method for determining partial discharges at an electrical component by means of a cluster analysis according to the present invention.
Figure 8:
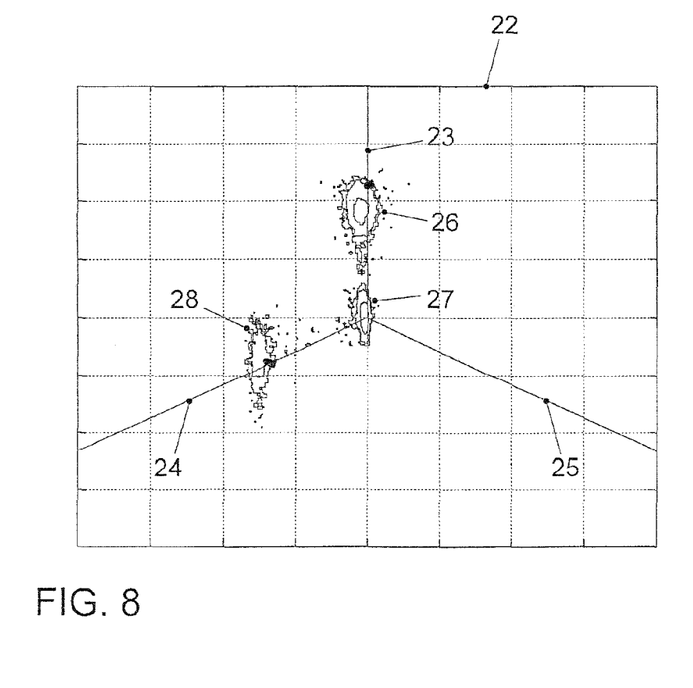
FIG. 8 shows a representation of a three-dimensional mapping space of the cluster analysis of FIG. 7.

A method of this cluster analysis is shown schematically in FIG. 7. As described in connection with FIG. 6, the measurement signal is amplified by means of the amplifier 17 and routed via the three filters 18-20. A cluster analysis, which, on the basis of the three filtered partial discharge signals of the filters 18-20, enters the partial discharge pulses into a three-dimensional mapping space 22, is then performed in the processing unit 21. FIG. 8 shows an enlarged representation of the three-dimensional mapping space 22, with the three spatial axes 23-25. Each partial discharge signal is entered into the mapping space 22 according to the filtered partial discharge signal values of the filters 18-20. The filtered partial discharge signal value of the filter 18 is plotted on the spatial axis 23, the filtered partial discharge signal value of the filter 19 is plotted on the spatial axis 24, and the filtered partial discharge signal value of the filter 20 is plotted on the spatial axis 25. In this manner, several thousand partial discharges are entered into the mapping space 22. Owing to the differing frequency signatures of the differing partial discharge sources of the test object 10, partial discharge accumulations ensue in certain regions of the mapping space 22. Three such accumulations, so-called clusters, are represented in FIG. 8. Partial discharges that are represented in the region of the cluster 26 have resulted in a large filtered partial discharge signal at the output of the filter 18 and in relatively small partial discharge signals at the outputs of the filters 19 and 20. By contrast, partial discharges in the region of the cluster 28 have resulted in large filtered partial discharge signals at the output of the filter 19 and in small partial discharge signals at the outputs of the filters 18 and 20. Partial discharge sources can thus be easily identified by the processing unit 21 on the basis of these frequency signatures that are assigned to the individual clusters 26-28. Moreover, outputs comparable to the output of FIG. 5 can be provided separately by the processing unit 21, for each of the clusters 26-28. This allows a more detailed analysis of the differing disturbance sources and of their effect upon the overall quality of the test object 10.

Although, as previously described, disturbance signals that are detected at the measuring point 16 can be filtered out insofar as possible by means of the filters 18-20, disturbance signals can nevertheless be present, for example in the passband range of the filters 18-20, which therefore cannot be eliminated by the filters 18-20. These disturbances, for example conducted disturbances from the supply voltage V or electromagnetic disturbances from radio transmitters or electrical machines or electrical lines in the environment of the test object 10, likewise results in accumulations or clusters in the mapping space 22, since, typically, each of these disturbances also has a characteristic frequency signature. By means of the cluster analysis, the processing unit 21 can identify such accumulations as disturbances and disregard them in the calculation of an overall partial discharge of the test object 10, in that the corresponding presumed, filtered partial discharge signals are disregarded. This enables the measuring accuracy to be improved considerably as compared with the partial discharge measuring device according to the prior art (FIG. 4).

Figure 9:
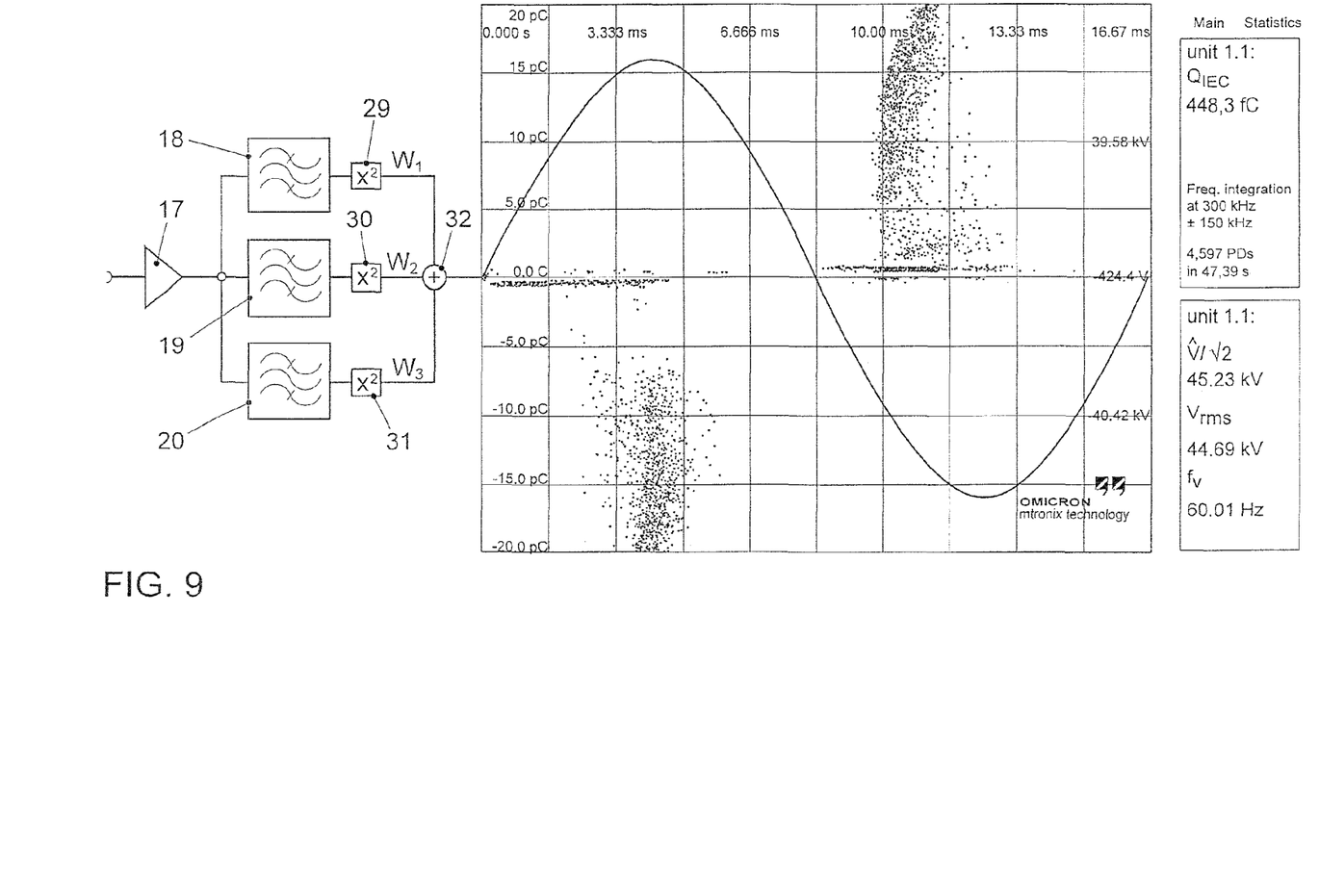
FIG. 9 shows, schematically, a method according to the present invention for determining partial discharges at an electrical component, wherein filtered partial discharge signals are added in a weighted manner.

In addition to the cluster analyses described in connection with FIGS. 7 and 8, the processing unit 21 performs a further processing of the filtered partial discharge signals of the filters 18-20. This further processing will be described in the following in connection with FIG. 9. FIG. 9 shows firstly, again, the amplifier 17 and the filters 18-20, as have already been described in connection with FIGS. 6 and 7. As shown in FIG. 9, each of the outputs of the filters 18-20 are now first squared by means of squaring elements 29-31 and are then each multiplied by a weighting factor $W_1$, $W_2$ and $W_3$, respectively, and are finally added, by means of an adder 32, to form a filtered overall partial discharge signal. The squaring of the outputs of the filters 18-20 by means of the squaring elements 29-31 serves substantially to provide an absolute value of the filter outputs. Since the filter outputs usually comprise complex values, a real absolute value can be easily provided by means of the squaring elements 29-31.

Analyses have shown that, for the above-mentioned passband ranges of the filters 18-20, the following values are particularly suitable for the weightings $W_1$-$W_3$:
$W_1$=1.0
$W_2$=1.1
$W_3$=1.0.

The advantage of the filter structure and further processing shown in FIG. 9, as compared with the filter 2 according to the prior art (FIG. 4), lies in the robustness of the filter structure according to the invention (FIG. 9) towards superposition effects of a plurality of partial discharge sources. A real filter such as, for example, the bandpass filter 2 shown in FIG. 4, can tend towards oscillations and/or to zeroizing when certain pulse patterns are applied to it. This can result in mutual extinction or weakening or superposition of two or more partial discharge pulses. This problem occurs particularly in the case of partial discharge measurements on cables. Here, an extinction, a so-called negative superposition, can occur as a result of a partial discharge pulse that is reflected at the cable end being superposed on an original partial discharge pulse. In the case of certain cable lengths, this results in a negative superposition, or even extinction, as a result of which a partial discharge fault on the cable is not detected. This negative superposition can be prevented through the use of the filter structure of FIG. 9. Even if one of the filters 18-20, because of its properties, has the pulse that is reflected at the end being negatively superposed on an original partial discharge pulse, and therefore does not output a filtered partial discharge signal, the two other filters of the filter structure 18-20 each output a filtered partial discharge signal, since their filter characteristics differ. The overall partial discharge measuring device therefore becomes considerably more robust towards this negative superposition phenomenon.

Since both the cluster analysis described in connection with FIGS. 7 and 8 and the weighted totalling described in connection with FIG. 9 are based on the parallel filtering of the partial discharge pulse by means of the filters 18-20, the two methods can be easily combined in a processing unit 21, in order to perform a partial discharge measurement that is both robust towards disturbance sources and robust towards the negative superposition described above. Moreover, the cluster analysis enables an improved identification of partial discharge disturbance sources to be provided.

The previously described methods and devices can be realized by analogue circuit technology, by digital circuit technology, e.g. by means of one or more microprocessors, or in a combination of analogue and digital circuit technology.

The invention claimed is:

1. Method for determining partial discharges in an electrical insulation system of an electrical component, comprising the steps:
   detecting an electrical signal that comprises partial discharge pulses due to dielectric breakdowns in the electrical insulation system of the electrical component,
   generating n filtered partial discharge signals by filtering the electrical signal by means of n filters having n differing filter characteristics, respectively one of the filtered partial discharge signals being assigned, respectively, to one of the n filters, n being greater than or equal to 2, and
   determining the partial discharges by linking the n filtered partial discharge signals,
   wherein an n-tuple is formed per partial discharge pulse, values of the n-tuple corresponding to the n filtered partial discharge signals of the partial discharge pulse, and the linking comprises a cluster analysis of the n-tuples, and
   wherein the electrical signal further comprises disturbance signals that are generated by a disturbance source inside or outside the electrical component and that are provided, as filtered partial discharge signals, by the n filters, the disturbance source is identified on the basis of at least one cluster of the cluster analysis, and only filtered partial discharge signals that were not generated by the disturbance source are used to determine the partial discharges of the electrical component.

2. Method according to claim 1, wherein a partial discharge source that causes a partial discharge in the electrical component is identified on the basis of at least one cluster of the cluster analysis.

3. Method according to claim 1, wherein the linking comprises determining an amount of each of the n filtered partial discharge signals, and weighted adding of the amounts of the n filtered partial discharge signals.

4. Method according to claim 3, wherein a first of the n filters is a bandpass filter having a passband range of approximately 82-243 kHz, a second of the n filters is a bandpass filter having a passband range of approximately 227-387 kHz, and a third of the n filters is a bandpass filter having a passband range of approximately 377-537 kHz, and a first weighting factor for the weighted adding of the partial discharge signal filtered by the first filter has the value 1, a second weighting factor for the weighted adding of the partial discharge signal filtered by the second filter has the value 1.1, and a third weighting factor for the weighted adding of the partial discharge signal filtered by the third filter has the value 1.

5. Method according to claim 1, wherein n=3.

6. Method according to claim 1, wherein the electrical component comprises a high-voltage cable, a transformer, an electrical generator or an electrical drive machine.

7. Device for determining partial discharges in an electrical insulation system of an electrical component, comprising
   an input connector for coupling the device to the electrical component, an electrical signal from the electrical component, which signal comprises partial discharge pulses resulting from dielectric breakdowns in the electrical insulation system of the electrical component, being able to be supplied to the device via the input connector, n filters that are coupled, on the input side, to the input connector and are designed to provide, on the output side, n filtered partial discharge signals in dependence on the electrical signal, the n filters having n differing filter characteristics, n being greater than or equal to 2, and a processing unit that is coupled to the outputs of the n filters, the processing unit being designed to determine partial discharges by linking the n filtered partial discharge signals, wherein the processing unit is designed to form an n-tuple per partial discharge pulse, values of the n-tuple corresponding to the n filtered partial discharge signals of the partial discharge pulse, and wherein the processing unit comprises a cluster analysis unit that is designed to determine clusters of partial discharge pulses by means of a cluster analysis of a plurality of n-tuples of a plurality of partial discharge pulses, and wherein the electrical signal further comprises disturbance signals that are generated by a disturbance source inside or outside the electrical component and that are provided, as filtered partial discharge signals, by the n filters, the processing unit is designed to use the clusters of the cluster analysis unit to identify the disturbance source on the basis of at least one cluster, and the processing unit is designed to determine the partial discharges of the electrical component in that it uses only filtered partial discharge signals that were not generated by the disturbance source.

8. Device according to claim 7, wherein the processing unit is designed to use the clusters of the cluster analysis unit to identify, on the basis of at least one cluster, a partial discharge source that causes a partial discharge at the electrical component.

9. Device according to claim 7, wherein the processing unit is designed to determine n amounts of the n filtered partial discharge signals, to multiply each of the n amounts by a weighting factor of its own, and to total the weighted amounts, in order to determine therefrom the amount of a partial discharge of the electrical component.

10. Device according to claim 9, wherein a first of the n filters is a bandpass filter having a passband range of approximately 82-243 kHz, a second of the n filters is a bandpass filter having a passband range of approximately 227-387 kHz, and a third of the n filters is a bandpass filter having a passband range of approximately 377-537 kHz, and a first weighting factor for the weighted adding of the partial discharge signal filtered by the first filter has the value 1, a second weighting factor for the weighted adding of the partial discharge signal filtered by the second filter has the value 1.1, and a third weighting factor for the weighted adding of the partial discharge signal filtered by the third filter has the value 1.

11. Device according to claim 7, wherein n=3.

12. Device according to claim 7, wherein the device further comprises a coupling capacitor and a measuring impedance, the coupling capacitor coupling the input connector to a voltage supply of the electrical component, and the measuring impedance coupling the input connector to a ground of the electrical component.

13. Device according to claim 7, wherein each of the n filters is designed in such a way that the filtered partial discharge signal is proportional to a charge of the corresponding partial discharge.

14. Device according to claim 7, wherein the electrical component comprises a high-voltage cable, a transformer, an electrical generator or an electrical drive machine.

15. Method for determining partial discharges in an electrical insulation system of an electrical component, comprising the steps:

detecting an electrical signal that comprises partial discharge pulses due to dielectric breakdowns in the electrical insulation system of the electrical component, generating n filtered partial discharge signals by filtering the electrical signal by means of n filters having n differing filter characteristics, respectively one of the filtered partial discharge signals being assigned, respectively, to one of the n filters, n being greater than or equal to 2, and determining the partial discharges by linking the n filtered partial discharge signals, wherein the linking comprises determining an amount of each of the n filtered partial discharge signals, and weighted adding of the amounts of the n filtered partial discharge signals.

16. Device for determining partial discharges in an electrical insulation system of an electrical component, comprising an input connector for coupling the device to the electrical component, an electrical signal from the electrical component, which signal comprises partial discharge pulses resulting from dielectric breakdowns in the electrical insulation system of the electrical component, being able to be supplied to the device via the input connector, n filters that are coupled, on the input side, to the input connector and are designed to provide, on the output side, n filtered partial discharge signals in dependence on the electrical signal, the n filters having n differing filter characteristics, n being greater than or equal to 2, and a processing unit that is coupled to the outputs of the n filters, the processing unit being designed to determine partial discharges by linking the n filtered partial discharge signals, wherein the processing unit is designed to determine n amounts of the n filtered partial discharge signals, to multiply each of the n amounts by a weighting factor of its own, and to total the weighted amounts, in order to determine therefrom the amount of a partial discharge of the electrical component.

* * * * *